US012796470B2

(12) United States Patent
Sui et al.

(10) Patent No.: US 12,796,470 B2
(45) Date of Patent: Nov. 10, 2026

(54) VAPOR CHAMBER FOR DUAL CAVITY HEAT SOURCES

(71) Applicant: Intel Corporation, Santa Clara, CA (US)

(72) Inventors: Linghe Sui, Shanghai (CN); Jun Liu, Shanghai (CN); Jiancheng Tao, Shanghai (CN); Tao Wang, Shanghai (CN); Chunlin Bai, Qingyang District (CN); Hongjun She, Shanghai (CN); Dengfeng Huang, Kunshan City (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/145,231

(22) Filed: Dec. 22, 2022

(65) Prior Publication Data

US 2023/0207424 A1 Jun. 29, 2023

(30) Foreign Application Priority Data

Dec. 22, 2022 (WO) ................ PCT/CN2022/140943

(51) Int. Cl.

| | |
|---|---|
| ***H10W 40/73*** | (2026.01) |
| ***H10W 90/00*** | (2026.01) |
| *F28D 15/02* | (2006.01) |
| *F28D 21/00* | (2006.01) |
| *F28F 9/22* | (2006.01) |

(52) U.S. Cl.

CPC ........... *H10W 40/73* (2026.01); *H10W 90/00* (2026.01); *F28D 15/0233* (2013.01); *F28D 2021/0028* (2013.01); *F28F 2009/228* (2013.01)

(58) Field of Classification Search

CPC ..... H10W 40/73; H10W 20/40; H10W 40/40; H10W 90/00; F28D 15/0233; F28D 2021/0028; F28F 2009/228

See application file for complete search history.

(56) References Cited

U.S. PATENT DOCUMENTS

| | | | | |
|---|---|---|---|---|
| 7,800,905 | B1 * | 9/2010 | Yu | F28D 15/0233 361/698 |
| 8,654,530 | B1 * | 2/2014 | Yu | G06F 1/203 165/80.4 |
| 9,291,399 | B2 * | 3/2016 | Barnes | F28D 15/06 |
| 2010/0309940 | A1 * | 12/2010 | Lee | F28D 15/0233 165/185 |
| 2010/0319881 | A1 * | 12/2010 | Wang | H01L 23/427 29/890.032 |
| 2018/0356156 | A1 * | 12/2018 | Hurbi | F28C 3/08 |
| 2020/0350229 | A1 * | 11/2020 | Chang | H01L 23/3675 |
| 2020/0387202 | A1 * | 12/2020 | Ho | G06F 1/3206 |

* cited by examiner

*Primary Examiner* — Eliseo Ramos Feliciano
*Assistant Examiner* — Brad A Knudson
(74) *Attorney, Agent, or Firm* — Alliance IP, LLC

(57) ABSTRACT

A vapor chamber architecture for multiple cavity/heat source system designs. The vapor chamber architecture can be customized in dimensions to cool two or more spatially separated, and potentially heterogeneous, heat sources in a system floor plan. The vapor chamber architecture can additionally be customized to concurrently manage the cooling requirements for the two or more heat sources that have different power consumptions and sizes. The provided vapor chamber architecture can be manufactured using etching processes, additive manufacturing processes, or the like.

20 Claims, 8 Drawing Sheets

VAPOR CHAMBER FOR DUAL CAVITY HEAT SOURCES

CROSS-REFERENCE TO RELATED APPLICATION

This application claims the benefit of International Application No. PCT/CN2022/140943, filed Dec. 22, 2022.

BACKGROUND

A heat source can become or create a hotspot (a volume or area of high temperature due to high power consumption levels). In devices or products with more than one heat source, power consumption and heat generated can vary across the device or product. The hotspots are thermal management challenges because excessive temperature can reduce lifetime and functionality of the integrated circuit components in a given device or product. Accordingly, continued improvements to cooling solutions such as vapor chamber apparatus are desired.

DETAILED DESCRIPTION

Figure 1A:
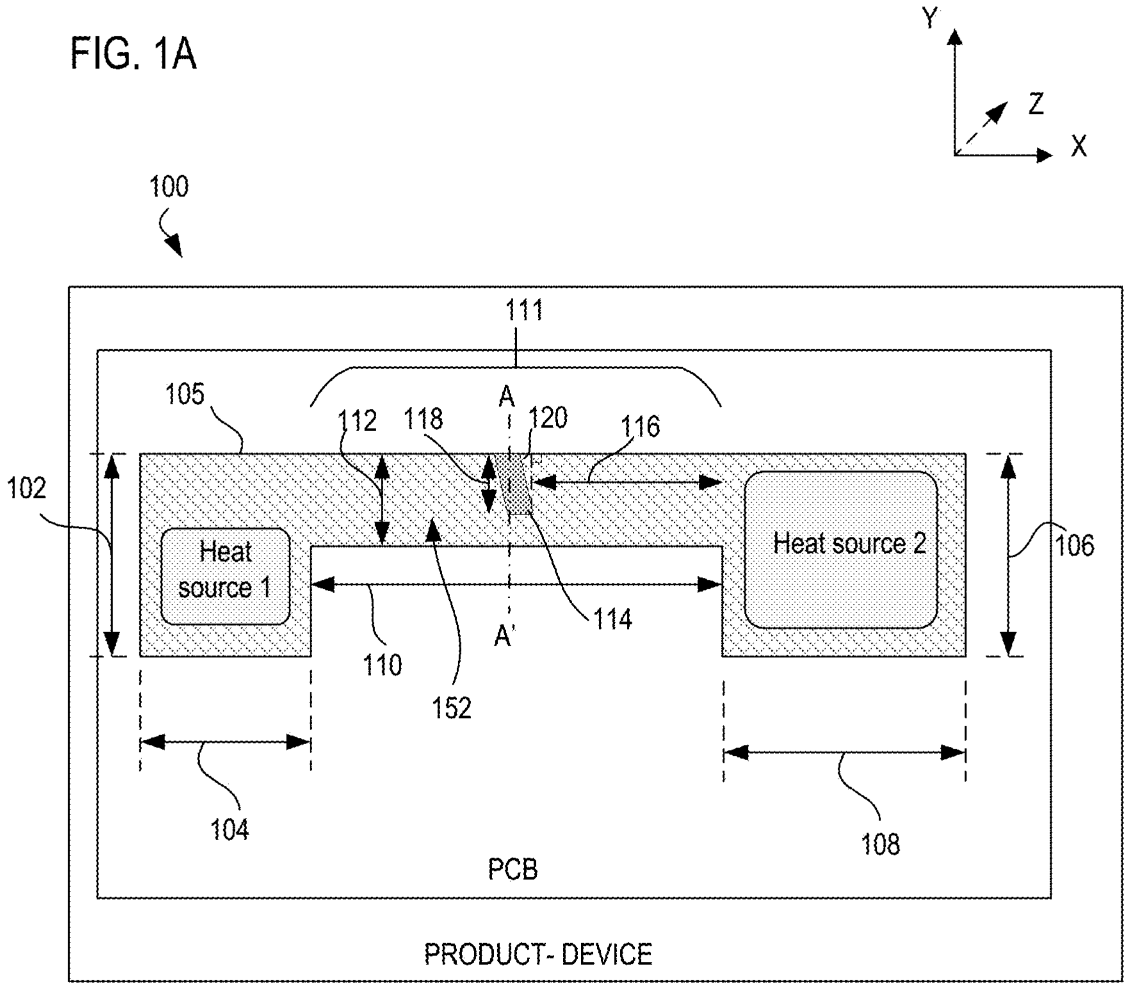
FIG. 1A is a simplified top-down view of a system floor plan for a product that utilizes a vapor chamber for dual cavity heat sources, in accordance with any of the embodiments disclosed herein.

In devices or products with more than one heat source, the variations in power consumption across the device can introduce technical challenges. Examples of heat sources include integrated circuit components that are different types of processor units, such as, a graphics processing unit (GPU), a high-performance central processing unit (CPU), and a low-power CPU. The volume surrounding the heat source can be referred to as a cavity, and during operation of the heat source, the heat source plus the cavity can become a hotspot (an area of high temperature due to high power consumption levels). The hotspots are thermal management challenges because excessive temperature can reduce lifetime and functionality of the integrated circuit components in a given device or product.

An approach for removing the requisite amount of heat at a hotspot to keep an integrated circuit component operating within its thermal limits is the application of cooling apparatus, such as a vapor chamber (VC) integrated heat spreader (IHS). However, the vapor chamber approach has a limit on an amount of power it can cool without failure. The vapor chamber employs a working fluid and a wick. The limit on the amount of power it can cool without failure is referred to as a maximum power, $Q_{max}$, and the working fluid is generally selected to maximize $Q_{max}$. Typically, this maximum power, $Q_{max}$, is due to a phenomenon called a capillary limit, which is a limit on, or a maximum mass rate of, a liquid the wick can pull back to a hotspot using its capillary forces. The failure mechanism for a vapor chamber is referred to as dry-out/dry-off. In practice, vapor chamber designs are faced with the competing demands of having a wick thick enough to allow enough working fluid to return to hotspot regions to allow for continued heat removal and having a vapor chamber thin enough to enable a low evaporative resistance.

Further complicating these challenges, products and devices that employ multiple heat sources, in ever smaller spaces, are driving more technically challenging cooling requirements. In a non-limiting example, a dual cavity device includes a CPU and a GPU. Spatially separating the CPU and GPU in a system floor plan can improve the cooling capacity as a first order solution, however, more cooling is still required. A vapor chamber can be added, but available vapor chamber designs cannot provide the cooling capacity required. For example, some devices and products are expected to require the maximum $Q_{max}$ to increase by 25% or more and to cool heat sources consuming 55 Watts or more.

Embodiments described herein provide a technical solution to the technical problems presented by multiple (potentially heterogeneous or diverse) heat sources. Embodiments include a single, heat spreader component having a vapor chamber with an internal structure customizable to control/accommodate for a vapor flow responsive to a variety of load (heat) scenarios; additionally, one or more fans can provide airflow/cooling to the system. Embodiments advantageously enable dynamically scaling heat dissipation/cooling between the multiple heat sources. Provided embodiments can improve the system cooling capacity by about 25% over available approaches. Provided embodiments can be manufactured using etching processes, additive manufacturing processes, or the like. The embodiments described herein can have the further advantage of enabling or continuing the use of thin vapor chambers. Thinner vapor chambers may enable thinner computing system designs that have a more aesthetically pleasing industrial design.

Embodiments described herein describe a vapor chamber for dual cavity heat sources. Embodiments can opportunistically be customized in dimensions to cool two heat sources that are separated spatially in a system floor plan. Embodiments can also be customized to concurrently manage the cooling requirements for two heat sources that have different power consumptions and sizes.

In the following description, for purposes of explanation, numerous specific details are set forth to provide a thorough understanding thereof. It may be evident, however, that the novel embodiments can be practiced without every one of these specific details. In other instances, well-known circuits, structures, and techniques may not have been shown in detail, to avoid obscuring an understanding of this description. Phrases such as “an embodiment,” “various embodiments,” “some embodiments,” and the like may include features, structures, or characteristics, but not every embodiment necessarily includes every feature, structure, or characteristic. The intention is to cover all modifications, equivalents, and alternatives within the scope of the claims.

Some embodiments may have some, all, or none of the features described for other embodiments. “First,” “second,” “third,” and the like describe a common object and indicate different instances of like objects being referred to. Such adjectives do not imply objects so described must be in a given sequence, either temporally or spatially, in ranking, or any other manner. “Connected” may indicate elements are in direct physical or electrical contact with each other and “coupled” may indicate elements co-operate or interact with each other, but they may or may not be in direct physical or electrical contact. Furthermore, the terms “comprising,” “including,” “having,” and the like, as used with respect to embodiments of the present disclosure, are synonymous.

As used herein, the phrase “located on,” in the context of a first layer or first component located on a second layer or second component, refers to either the first layer or component being directly physically attached to the second layer or component (no layers or components between the first and second layers or components), or the first layer or component being physically attached to the second layer or component via one or more intervening layers or components.

As used herein, the terms “processor unit”, “processing unit” or “processor” may refer to any device or portion of a device that processes electronic data from registers and/or memory to transform that electronic data into other electronic data that may be stored in registers and/or memory. A processor unit may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

As used herein, the term “electronic component” can refer a battery, or a passive electronic component (e.g., a resistor, an inductor, and a capacitor).

An “integrated circuit component,” as used herein, can comprise at least one processor unit or at least one electronic component, or a combination of processor units and electronic components. Non-limiting examples of an integrated circuit component include a single monolithic integrated circuit die, embodiments of which may have solder bumps attached to contacts on the die, to allow the die to be directly attached to a package substrate or printed circuit board.

As used herein, the phrase “thermally coupled” refers to components that are coupled to facilitate the transfer of heat between them. A thermal interface material (TIM) can be any suitable material to achieve thermal coupling, such as, a silver thermal compound, thermal grease, phase-change materials, indium foils or graphite sheets.

As used herein, the phrase “mechanically coupled” refers to components that are affixed or physically attached (as may be achieved by any combination of soldering, the use of adhesives, the use of fasteners, or the like) to each other, often, to achieve a resulting structure. In various embodiments, mechanically coupled can include releasably attached configurations, such as, those that require application of a torque exceeding a threshold torque to release them.

As may be appreciated by one with skill in the art, thermally coupled and mechanically coupled are not necessarily mutually exclusive, and a coupling between two components can facilitate more than one purpose.

Reference is now made to the drawings, which are not necessarily drawn to scale, but can be relied upon for general location and orientation purposes for one or more embodiments. As may be appreciated, certain terminology, such as “ceiling” and “floor”, as well as “upper,” “uppermost”, “lower,” “above,” “below,” “bottom,” and “top” refer to directions based on viewing the Figures to which reference is made. Further, terms such as “front,” “back,” “rear,” “side”, “vertical”, and “horizontal” may describe the orientation and/or location of portions of the component within a consistent but arbitrary frame of reference which is made clear by reference to the text and the associated Figures describing the component under discussion. Such terminology may include the words specifically mentioned above, derivatives thereof, and words of similar import.

In the drawings, similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

FIG. 1A view 100 is a simplified top-down or X-Y plane view of a product/device or system comprising a first heat source (heat source 1) and a second heat source (heat source 2). In an embodiment, the product may be a laptop computer. Heat source 1 and heat source 2 may be different integrated circuit die, having different dimensions, functions, and heat output. In a non-limiting example, heat source 1 is a graphics processing unit (GPU) and heat source 2 is a central processing unit (CPU). In some embodiments, the components of view 100 are enclosed in a housing and comprise a device, such as the illustration in FIG. 8.

An embodiment of a vapor chamber 105 is shown extending across heat source 1 and heat source 2. A first cavity (cavity 1) having width 102 and length 104, is associated with (and sized based on) the first heat source (HS 1), and a second cavity (cavity 2) having width 106 and length 108, is associated with (and sized based on) the second heat source (HS 2). The dimensions of cavity 1 are customizable to cool heat source 1 (HS 1) and the dimensions of cavity 2 are customizable to cool heat source 2 (HS 2). In an embodiment, cavity 1 is a different area than cavity 2. In other embodiments, cavity 1 and cavity 2 share a same area.

A heat transfer portion 111 serves as a condenser for vapor traveling through it. The heat transfer portion 111 provides fluid communication between cavity 1 and cavity 2, wherein a vapor channel length 110 of the heat transfer portion 111 generally represents a distance between HS 1 and HS 2.

Figure 1B:
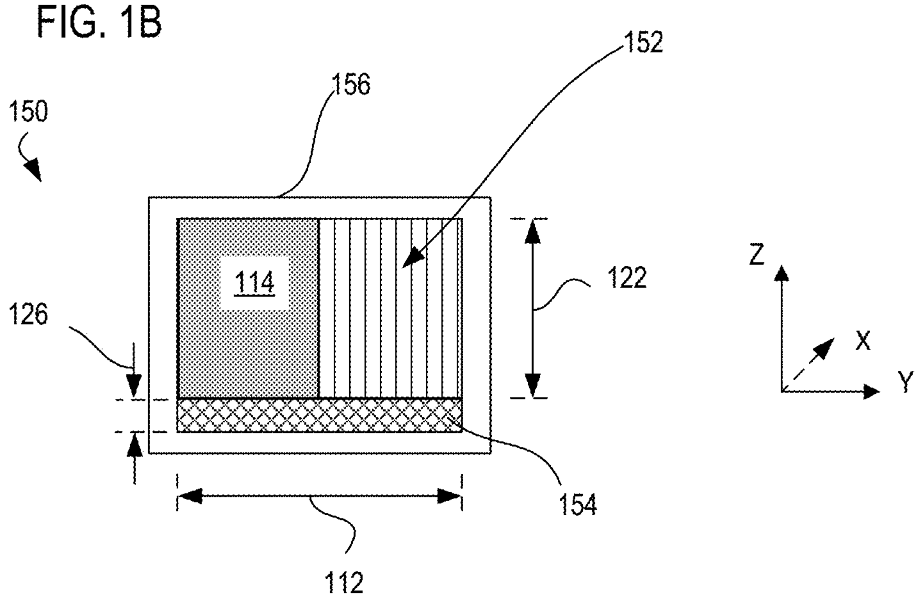
FIG. 1B is a simplified cross-sectional view of a heat transfer portion of a vapor chamber, in accordance with any of the embodiments disclosed herein.

FIG. 1B view 150 is a simplified cross-sectional view of the heat transfer portion 111, through the cut line A-A'. The dimensions of the heat transfer portion 111 are customized to accommodate a system floor plan for the device and also to meet cooling requirements for heat source 1 and heat source 2. The heat transfer portion 111 comprises a vapor channel 152, a wick material 154, and a working fluid. A housing 156 may enclose the components of the heat transfer portion 111. The housing 156 may comprise a metal or other thermally conductive material, and may be fabricated with an additive manufacturing process, or molded or etched.

As used herein, a "terminus" can embody a volume in three dimensions or a line or point in two dimensions, and a terminus shall mean an end for a component characterized by a first end, a second end, and a length therebetween. In a first non-limiting embodiment in view 100, the heat transfer portion 111 has vapor channel length 110, does not include the volume of associated cavities, but is thermally coupled to the one or more associated cavities. Specifically, the embodiment in view 100 depicts a heat transfer portion 111 limited to vapor channel length 110, having a first terminus at one end of the arrow 110 "at the cavity 1" and a second terminus at the opposite end of the arrow 110 "at the cavity 2." In three dimensions, this embodiment of the heat transfer portion 111 has a volume of (110×112×(126+122)).

In some embodiments, the heat transfer portion 111 is defined by length 110 plus length 104 plus length 108 (i.e., a first terminus includes vapor channel length 110 plus a first cavity length and a second terminus includes a second cavity length). In three dimensions, these embodiments of the heat transfer portion 111 can have a volume of (110+104+108)×112×(126+122).

In still other embodiments, the heat transfer portion 111 further includes an entire volume of the first cavity and entire volume of the second cavity. In three dimensions, these embodiments of the heat transfer portion 111 can have a volume of ((102×104)+(112×110)+(106×108))×(122+126).

In various embodiments, cavity 1 is thermally coupled to HS 1 and cavity 2 is thermally coupled to HS 2. In various embodiments, the heat transfer portion 111 is thermally coupled to HS 1 and to HS 2. In various embodiments, the vapor chamber 105 is thermally coupled to HS 1 and to HS 2. In various embodiments, a first terminus of the heat transfer portion 111 is thermally coupled via a first cavity to a first heat source and a second terminus of the heat transfer portion 111 is thermally coupled via a second cavity to a second heat source.

An overall length of the vapor chamber 105 includes length 104 plus vapor channel length 110 plus length 108. In various embodiments, the vapor channel length 110 is in a range of about 40% to about 80% of the overall length of the vapor chamber 105 (wherein about means plus or minus 10%). The channel width 112 is in a range of about 20% to about 80% of the width 102, and preferably in a range of about 30% to about 70% of the width 102. In an embodiment, the width of the gate is 0.10 millimeters, and a height of the gate (in the Z direction in the figure) is about 0.9 millimeters.

A lower portion of the heat transfer portion 111 (indicated with height 126 and width 112) is a volume in three dimensions and represents where the working fluid is generally in liquid form. The lower portion may comprise a first wick material and/or first wick pattern. An upper portion, which is an area above the liquid portion (indicated with height 122 and width 112) is, in practice, also a volume and may be where the working fluid is in a gaseous state. In various embodiments, the upper portion may comprise a filling pattern or material (e.g., see FIG. 4). An overall heat transfer portion 111 cross-sectional area is then defined as width 112 by (height 122 plus height 126). In various non-limiting embodiments, the area of the liquid portion comprises about 10% to about 40% of the overall vapor channel cross sectional area.

The working fluid is a two-phase working fluid, meaning that it is in a liquid phase in the wick material 154, and in a gaseous phase above the wick, in the vapor channel 152. The working fluid can comprise water, ammonia, methanol, refrigerants, ethanol, or any of the following fluids or mixture of fluids: sodium dodecyl (SDS), lauryl sulfate (SLS), water and alcohol (the alcohol percentage can range from 10-80%), water and pentane, methanol, ethanol, water and propylene glycol (the propylene glycol percentage can range from 15%-80%), ammonia, ethane, acetone, pentane, refrigerant R 141b (dichlorofluoroethane), refrigerant R-134a, or another fluid or fluid mixture suitable for the purpose described herein.

The wick material 154 can comprise sintered copper powder, copper fibers (which, in some embodiments, can be woven into forms such as a screen, mesh, or braids), or grooves integrated or etched into an inner surface of the housing 156 of the heat transfer portion 111. The wick material 154 can comprise a pattern or a plurality of patterns.

In various embodiments, the vapor chamber 105 is planar; in various embodiments, the vapor chamber 105 is coplanar with a printed circuit board (PCB, as shown in FIG. 1A) on which the heat source 1, heat source 2 and vapor chamber 105 are attached. The PCB may then be attached to a device or housed as a product. The heat transfer portion 111 may be formed with a cold plate made of any suitable material for the purpose that is chemically compatible with immersion and working fluids, such as, copper, aluminum, or stainless steel, and in accordance with industry standards. In various embodiments, the entire vapor chamber 105 and/or the heat transfer portion 111 can be created by one or more of the following processes: stamping a material into a shape, etching a material, separately etching or building a top half and a bottom half and then attaching them together with a sealant, attaching a top half and a bottom half, creating part or all of the vapor chamber with additive manufacturing.

Embodiments include a gate 114 located in the heat transfer portion 111, included in, or integrated within, the vapor channel 152, between a first terminus and a second terminus. In the non-limiting example of FIG. 1B, the gate 114 is attached, included, mechanically coupled to, or otherwise integrated to, at least one support structure within the vapor channel of the heat transfer portion 111. In various embodiments, the support structure may be at least one wall of the heat transfer portion 111. With reference to FIG. 1A, the gate 114 is located at a distance 116 from the cavity 2 (as will be described in more detail in connection with FIG. 3, distance 116 represents a reflow distance for HS 2 and also for HS 1).

In various embodiments, the gate 114 may be oriented at an angle 120 measured from the first wall of the vapor channel 152, opened toward HS 2, as shown. In other embodiments, the gate 114 is seamless with at least two of four walls of the vapor channel (top and left, in FIG. 1B), in other words, with a first wall (as illustrated in FIG. 1A) and a ceiling (in the Z directions, as illustrated in FIG. 1B). In an embodiment, the gate is located at a distance 116 that is in a range of about 30% to about 70% of the vapor channel length 110 (measured from HS 2 in the figures). In various embodiments, the angle 120 is in a range of about 45° to about 90°, and preferably in a range of about 50° to about 70°.

The gate 114 provides a blocking function by blocking an amount represented by width 118. In the portion of the vapor chamber 105 having the gate 114, e.g., for a width 118 of the channel, the gate 114 blocks vapor flow attempting to move right to left, causing a portion of the total vapor flow leaving heat source 2 to return toward heat source 2. In various embodiments, the width 118 controls an amount of vapor to be shared between the first cavity and the second cavity. In various embodiments, the gate 114 blocks or occludes about 30% to about 70% of the vapor flow that would occur when one or both of the heat sources are operating.

Figure 2:
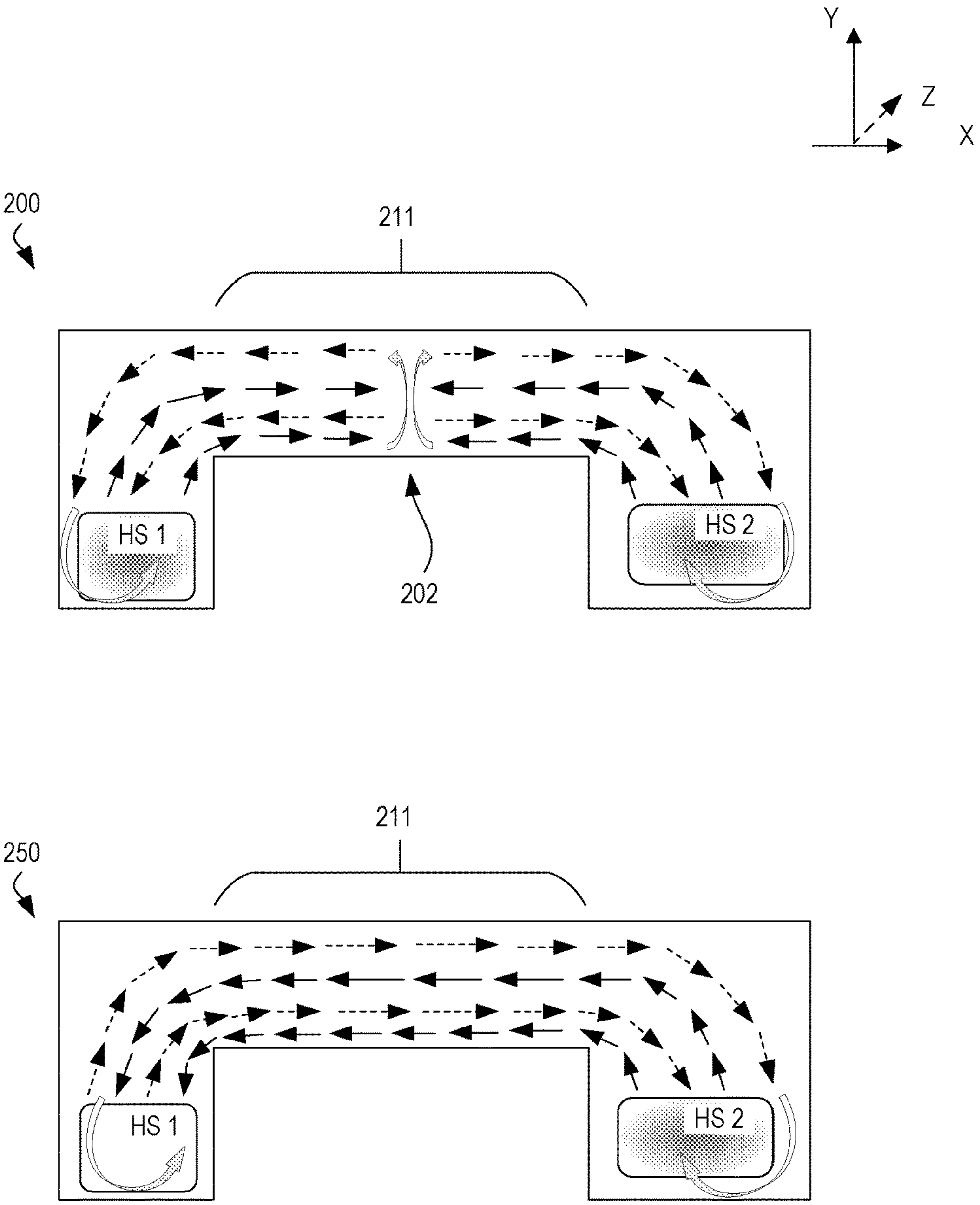
PRIOR ART FIG. 2
FIG. 2 provides simplified top-down views showing cooling behavior in vapor chamber embodiments without the design improvements of provided embodiments.

FIG. 2 provides simplified top-down views showing cooling behavior in vapor chamber embodiments without the improvements provided by proposed embodiments. In various embodiments, the vapor chamber is thermally coupled to heat source 1 and to heat source 2. In view 200, heat source 1 (HS 1) and heat source 2 (HS 2) are both functioning as evaporators, i.e., both are running or consuming power and creating heat. In an embodiment, HS 1 may represent a GPU and HS 2 may represent a CPU and view 200 can be referred to as CPU+GPU dual-stress loading. In this scenario, vapor heated from the CPU side and from the GPU side travel toward the center of the heat transfer portion 211, which operates as a condenser, meeting at 202, where the condensed liquid can be pushed back to its source easily, as shown. For simplicity, this is illustrated using solid arrows to represent hot vapor moving in its travel direction, which is away from a heat source and into the heat transfer portion 211 (which serves as a condenser). The hot vapor condenses as it travels through the heat transfer portion 211, changing phase to a liquid. The flow of the liquid is indicated with dashed arrows, which is, directionally, from the heat transfer portion 111 toward the respective heat source.

In contrast, in view 250, only one of the heat sources (HS 2) is operating or consuming power and creating heat. This may represent CPU or GPU single stress loading. In this scenario, vapors need to flow from the right side to the left side, and liquid needs to flow back from the left to the right. In this scenario, vapor heated from the HS 2 (CPU) side may travel all the way across the heat transfer portion 211 and may even travel into the chamber/cavity for HS1 (GPU). Likewise, cooled liquid can flow all the way from the chamber/cavity at HS 1 to the chamber/cavity at HS 2. Comparing embodiment 200 to embodiment 250, it is observable that the travel length in embodiment 250 is longer than it is in embodiment 200.

However, when the HS 2 is operating at a "high" power (e.g., about 55 Watts or more) the floor plan of a system or product shown in view 250 can cause a technical problem for a product design for the following reason. With the vapor chamber solution of view 200 and view 250, based in part on the length of the heat transfer portion 111, some vapor may not be able to reflow from the left side to the right side as needed; consequently, liquid can over accumulate or pile up at the "cold side" or cavity with the heat source that is not operating (HS 1 in this example). This can cause heat stress on HS 2 and prohibit the ability for the vapor chamber to balance the heat transfer. As mentioned above, heat stress on the system or product or device can be detrimental to operation and reliability.

Figure 3:
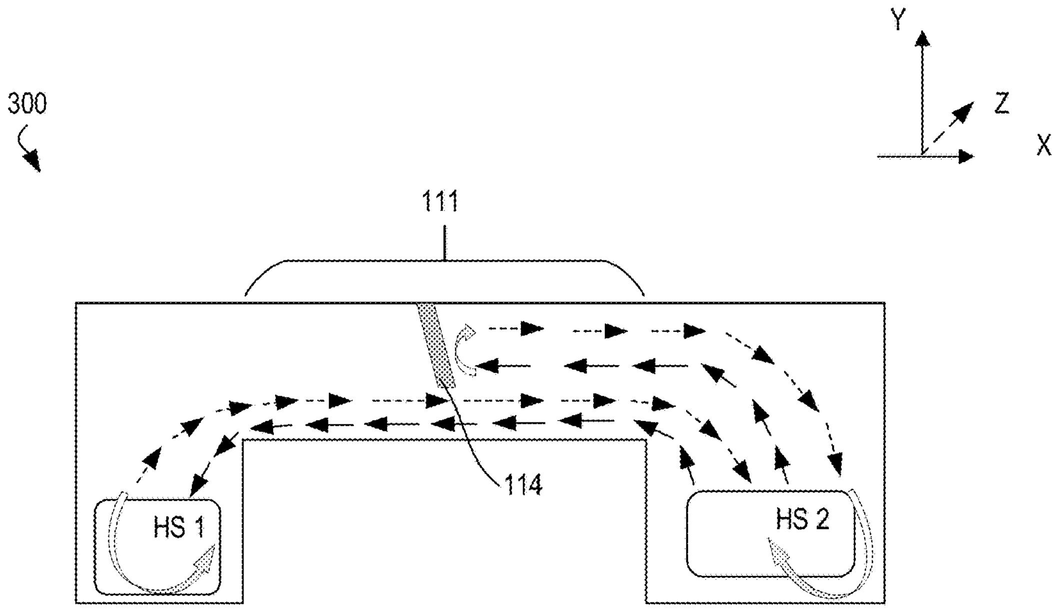
FIG. 3 provides simplified top-down views showing cooling behavior in vapor chamber embodiments with the design improvements of provided embodiments.
Figure 3:
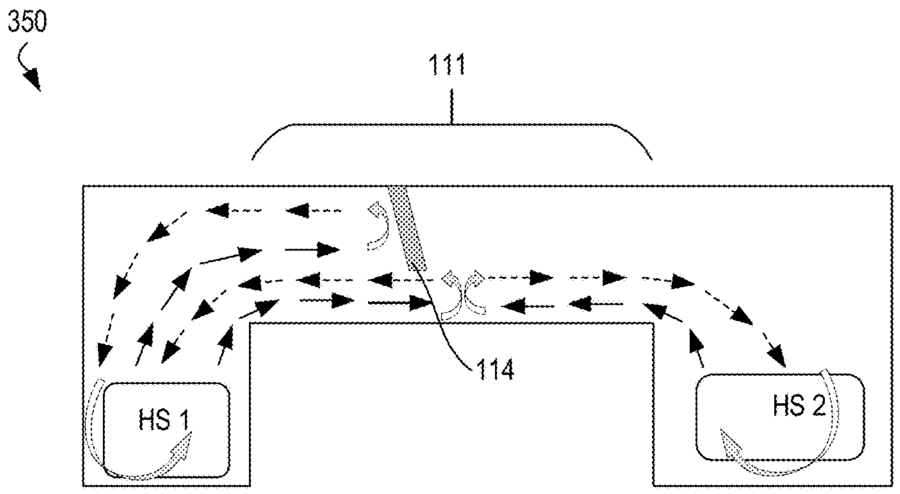

FIG. 3 provides simplified top-down views showing improved cooling behavior provided by vapor chamber 105 embodiments that implement a heat transfer portion 111 with the described gate 114. The gate 114 is mechanically coupled or integrated within the vapor channel of the heat transfer portion 111. The gate 114 advantageously improves performance of the vapor chamber 105 in scenarios such as described in connection with views 200 and 250. As illustrated in embodiment 300, the gate blocks the traverse of vapor from right to left (also referred to as reducing a reflow distance) when HS 2 (e.g., a CPU) is operating and creating heat. Additionally, as shown in embodiment 350, if HS 2 is stressed, this embodiment ensures that the HS 1 can be cooled to maintain about 10 Watts of operating power, so that it can support basic operating system (OS) operations. The gate 114 also reduces a reflow distance on the side of HS 1 (e.g., on a GPU side).

Figure 4:
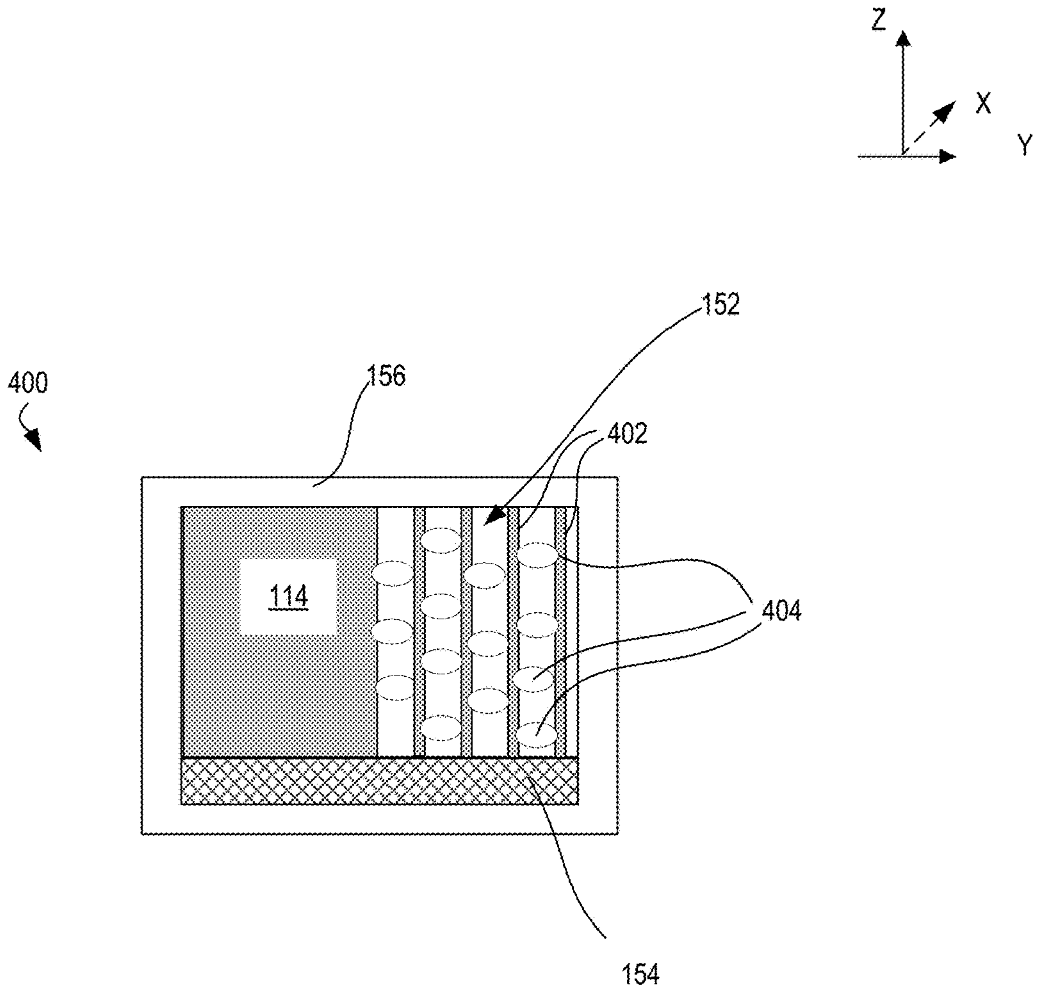
FIG. 4 illustrates a cross-sectional view of a heat transfer portion of a vapor chamber, in accordance with any of the embodiments disclosed herein, for a more detailed discussion.

FIG. 4 illustrates a cross-sectional view 400 of a heat transfer portion 111 of a vapor chamber 105, in accordance with any of the embodiments disclosed herein, providing further non-limiting examples. In some embodiments, the vapor channel 152 may comprise a plurality of pillars 402. The pillars 402 may be substantially perpendicular to an upper surface of the heat transfer portion 111, as shown. In various embodiments, the vapor channel may include fibers 404. The fibers 404 are oriented laterally in the heat transfer portion 111 (i.e., coaxial with a direction of vapor flow and substantially perpendicular to the pillars 402), as shown in FIG. 4. In various embodiments, the vapor channel may include both pillars 402 and fibers 404, as shown in view 400. The pattern or combination of patterns employed in the vapor chamber 105 can be selected to work with a particular working fluid, overall vapor chamber length, and maximum power, $Q_{max}$ required by a specific system floor plan, product, or device. As mentioned, the gate 114 can be created by a change in an etching pattern employed during fabrication of the vapor channel 152, or in an additive manufacturing process.

In other embodiments, the vapor chamber 105 can be described as a cooling apparatus, and/or a heat transfer means configured to cool a first heat source and a second heat source using a liquid flow rate. The heat transfer means can be in fluid communication with a first cavity and a second cavity. The first heat source can be thermally coupled to the first cavity and the second heat source can be thermally coupled to the second cavity. A blocking means can be within the heat transfer means, the blocking means configured to occlude from about 30% to about 70% of vapor flow.

The enhanced cooling capacity provided by embodiments translates to an increased burst power limit and power consumption for a variety of system floor plans and products/devices. When this technical solution is implemented with two distinguishably different heat sources, the technical improvements provided by this design are further illustrated.

Thus, a vapor chamber for dual cavity heat sources has been described. Embodiments can opportunistically be customized in dimensions to cool two heat sources that are separated spatially in a system floor plan. Embodiments can also be customized to concurrently manage the cooling requirements for two heat sources that have different power consumptions and sizes. Provided embodiments can be manufactured using etching processes, additive manufacturing processes, or the like. The embodiments described herein can have the further advantage of enabling or continuing the use of thin vapor chambers. Thinner vapor chambers may enable thinner computing system designs.

Provided embodiments may be used with a variety of integrated circuit die, related assemblies, and final products. FIGS. 5-8 provide examples of die, assemblies, and devices that may implement the provided vapor chamber design.

Figure 5:
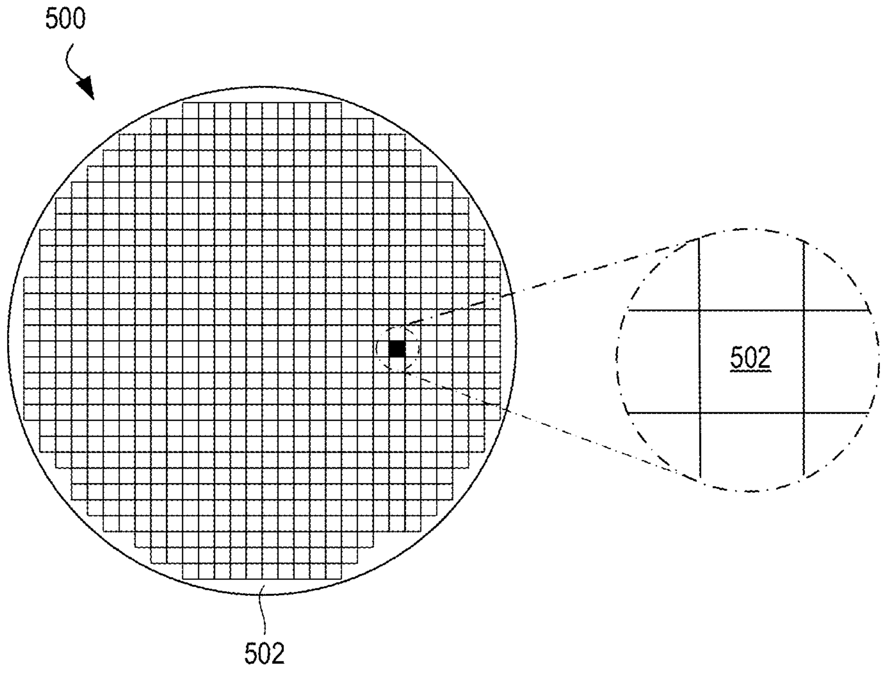
FIG. 5 is a top view of a wafer and dies that may embody unpackaged integrated circuit components, in accordance with any of the embodiments disclosed herein.

FIG. 5 is a top view of a wafer 500 and dies 502 that may represent the integrated circuit components coupled to the heat spreader 105 apparatus disclosed herein (e.g., any of the dies 502 may be a heat source 1 or a heat source 2). The wafer 500 may be composed of semiconductor material and may include one or more dies 502 having integrated circuit structures formed on a surface of the wafer 500. The individual dies 502 may be a repeating unit of a semiconductor integrated circuit product that includes one or more integrated circuit components. After the fabrication of the integrated circuit product is complete, the wafer 500 may undergo a singulation process in which the dies 502 are separated from one another to provide discrete "chips" of the integrated circuit product. The die 502 may be any of the heat sources disclosed herein.

The die 502 may include one or more transistors (e.g., some of the transistors 640 of FIG. 6, discussed below), supporting circuitry to route electrical signals to the transistors, passive components (e.g., signal traces, resistors, capacitors, or inductors), and/or any other integrated circuit components. In some embodiments, the wafer 500 or the die 502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processor unit (e.g., the processor unit 802 of FIG. 8) or other logic that is configured to store information in the memory devices or execute instructions stored in the memory array. Various ones of the microelectronic assemblies disclosed herein may be manufactured using a die-to-wafer assembly technique in which some dies, one or more of which being a heat source 1, are attached to a wafer 500 that include others of the dies, and the wafer 500 is subsequently singulated.

Figure 6:
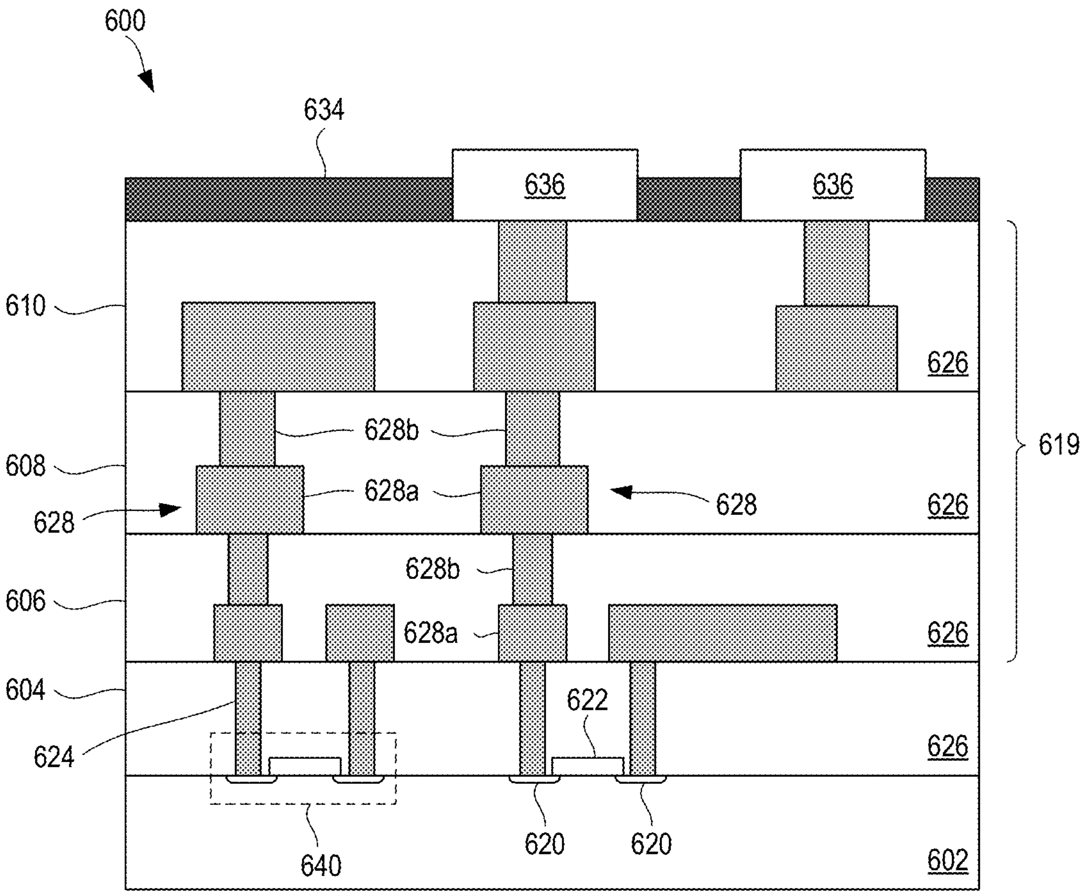
FIG. 6 is a simplified cross-sectional side view showing an implementation of an integrated circuit component on a die, in accordance with various embodiments disclosed herein.

FIG. 6 is a simplified cross-sectional side view showing an implementation of an integrated circuit component 600, such as may be present in a die that is used as the heat source 1 or heat source 2. One or more of the integrated circuit components 600 may be included in one or more dies 502 (FIG. 5). The integrated circuit component 600 may be formed on a die substrate 602 (e.g., the wafer 500 of FIG. 5) and may be included in a die (e.g., the die 502 of FIG. 5). The die substrate 602 may be a semiconductor substrate composed of semiconductor material systems including, for example, n-type or p-type materials systems (or a combination of both). The die substrate 602 may include, for example, a crystalline substrate formed using a bulk silicon or a silicon-on-insulator (SOI) substructure. In some embodiments, the die substrate 602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 602. Although a few examples of materials from which the die substrate 602 may be formed are described here, any material that may serve as a foundation for an integrated circuit component 600 may be used. The die substrate 602 may be part of a singulated die (e.g., the dies 502 of FIG. 5) or a wafer (e.g., the wafer 500 of FIG. 5).

The integrated circuit component 600 may include one or more device layers 604 disposed on the die substrate 602. The device layer 604 may include features of one or more transistors 640 (e.g., metal oxide semiconductor field-effect transistors (MOSFETs)) formed on the die substrate 602. The transistors 640 may include, for example, one or more source and/or drain (S/D) regions 620, a gate 622 to control current flow between the S/D regions 620, and one or more S/D contacts 624 to route electrical signals to/from the S/D regions 620. The transistors 640 may include additional features not depicted for the sake of clarity, such as device isolation regions, gate contacts, and the like. The transistors 640 are not limited to the type and configuration depicted in FIG. 6 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

Returning to FIG. 6, a transistor 640 may include a gate 622 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 640 along the source-channel-drain direction, the gate electrode may consist of a U-shaped structure that includes a bottom portion substantially parallel to the surface of the die substrate 602 and two sidewall portions that are substantially perpendicular to the top surface of the die substrate 602. In other embodiments, at least one of the metal layers that form the gate electrode may simply be a planar layer that is substantially parallel to the top surface of the die substrate 602 and does not include sidewall portions substantially perpendicular to the top surface of the die substrate 602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 620 may be formed within the die substrate 602 adjacent to the gate 622 of individual transistors 640. The S/D regions 620 may be formed using an implantation/diffusion process or an etching/deposition process, for example. In the former process, dopants such as boron, aluminum, antimony, phosphorous, or arsenic may be ion-implanted into the die substrate 602 to form the S/D regions 620. An annealing process that activates the dopants and causes them to diffuse farther into the die substrate 602 may follow the ion-implantation process. In the latter process, the die substrate 602 may first be etched to form recesses at the locations of the S/D regions 620. An epitaxial deposition process may then be carried out to fill the recesses with material that is used to fabricate the S/D regions 620. In some implementations, the S/D regions 620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 620 may be formed using one or more alternate semiconductor materials such as germanium or a group III-V material or alloy. In further embodiments, one or more layers of metal and/or metal alloys may be used to form the S/D regions 620.

Electrical signals, such as power and/or input/output (I/O) signals, may be routed to and/or from the devices (e.g., transistors 640) of the device layer 604 through one or more interconnect layers disposed on the device layer 604 (illustrated in FIG. 6 as interconnect layers 606-610). For example, electrically conductive features of the device layer 604 (e.g., the gate 622 and the S/D contacts 624) may be electrically coupled with the interconnect structures 628 of the interconnect layers 606-610. The one or more interconnect layers 606-610 may form a metallization stack (also referred to as an "ILD stack") 619 of the integrated circuit component 600.

The interconnect structures 628 may be arranged within the interconnect layers 606-610 to route electrical signals according to a wide variety of designs; in particular, the arrangement is not limited to the particular configuration of interconnect structures 628 depicted in FIG. 6. Although a particular number of interconnect layers 606-610 is depicted in FIG. 6, embodiments of the present disclosure include integrated circuit components having more or fewer interconnect layers than depicted.

In some embodiments, the interconnect structures 628 may include lines **628*a* and/or vias 628*b* filled with an electrically conductive material such as a metal. The lines 628*a* may be arranged to route electrical signals in a direction of a plane that is substantially parallel with a surface of the die substrate 602 upon which the device layer 604 is formed. For example, the lines 628*a* may route electrical signals in a direction in and out of the page and/or in a direction across the page. The vias 628*b* may be arranged to route electrical signals in a direction of a plane that is substantially perpendicular to the surface of the die substrate 602 upon which the device layer 604 is formed. In some embodiments, the vias 628*b* may electrically couple lines 628*a* of different interconnect layers 606-610** together.

The interconnect layers 606-610 may include a dielectric material 626 disposed between the interconnect structures 628, as shown in FIG. 6. In some embodiments, dielectric material 626 disposed between the interconnect structures 628 in different ones of the interconnect layers 606-610 may have different compositions; in other embodiments, the composition of the dielectric material 626 between different interconnect layers 606-610 may be the same. The device layer 604 may include a dielectric material 626 disposed between the transistors 640 and a bottom layer of the metallization stack as well. The dielectric material 626 included in the device layer 604 may have a different composition than the dielectric material 626 included in the interconnect layers 606-610; in other embodiments, the composition of the dielectric material 626 in the device layer 604 may be the same as a dielectric material 626 included in any one of the interconnect layers 606-610.

A first interconnect layer 606 (referred to as Metal 1 or "M1") may be formed directly on the device layer 604. In some embodiments, the first interconnect layer 606 may include lines **628*a* and/or vias 628*b*, as shown. The lines 628*a* of the first interconnect layer 606 may be coupled with contacts (e.g., the S/D contacts 624) of the device layer 604. The vias 628*b* of the first interconnect layer 606 may be coupled with the lines 628*a* of a second interconnect layer 608**.

The second interconnect layer 608 (referred to as Metal 2 or "M2") may be formed directly on the first interconnect layer 606. In some embodiments, the second interconnect layer 608 may include via **628*b* to couple the lines 628 of the second interconnect layer 608 with the lines 628*a* of a third interconnect layer 610. Although the lines 628*a* and the vias 628*b* are structurally delineated with a line within individual interconnect layers for the sake of clarity, the lines 628*a* and the vias 628*b*** may be structurally and/or materially contiguous (e.g., simultaneously filled during a dual-damascene process) in some embodiments.

The third interconnect layer 610 (referred to as Metal 3 or "M3") (and additional interconnect layers, as desired) may be formed in succession on the second interconnect layer 608 according to similar techniques and configurations described in connection with the second interconnect layer 608 or the first interconnect layer 606. In some embodiments, the interconnect layers that are "higher up" in the metallization stack 619 in the integrated circuit component 600 (i.e., farther away from the device layer 604) may be thicker than the interconnect layers that are lower in the metallization stack 619, with lines **628*a* and vias 628*b*** in the higher interconnect layers being thicker than those in the lower interconnect layers.

The integrated circuit component 600 may include a solder resist material 634 (e.g., polyimide or similar material) and one or more conductive contacts 636 formed on the interconnect layers 606-610. In FIG. 6, the conductive contacts 636 are illustrated as taking the form of bond pads. The conductive contacts 636 may be electrically coupled with the interconnect structures 628 and configured to route the electrical signals of the transistor(s) 640 to external devices. For example, solder bonds may be formed on the one or more conductive contacts 636 to mechanically and/or electrically couple an integrated circuit die including the integrated circuit component 600 with another component (e.g., a printed circuit board). The integrated circuit component 600 may include additional or alternate structures to route the electrical signals from the interconnect layers 606-610; for example, the conductive contacts 636 may include other analogous features (e.g., posts) that route the electrical signals to external components.

In some embodiments in which the integrated circuit component 600 (e.g., heat source 1) is a double-sided die, the integrated circuit component 600 may include another metallization stack (not shown) on the opposite side of the device layer(s) 604. This metallization stack may include multiple interconnect layers as discussed above with reference to the interconnect layers 606-610, to provide conductive pathways (e.g., including conductive lines and vias) between the device layer(s) 604 and additional conductive contacts (not shown) on the opposite side of the integrated circuit component 600 from the conductive contacts 636.

In other embodiments in which the integrated circuit component 600 is a double-sided die, the integrated circuit component 600 may include one or more through silicon vias (TSVs) through the die substrate 602; these TSVs may make contact with the device layer(s) 604, and may provide conductive pathways between the device layer(s) 604 and additional conductive contacts (not shown) on the opposite side of the integrated circuit component 600 from the conductive contacts 636. In some embodiments, TSVs extending through the substrate can be used for routing power and ground signals from conductive contacts on the opposite side of the integrated circuit component 600 from the conductive contacts 636 to the transistors 640 and any other components integrated into the die 600, and the metallization stack 619 can be used to route I/O signals from the conductive contacts 636 to transistors 640 and any other components integrated into the die 600.

Multiple integrated circuit components 600 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

In various embodiments, the integrated circuit components 600 are assembled into packaged integrated circuit components. A packaged integrated circuit component can comprise one or more of the aforementioned integrated circuit dies mounted on a package substrate. The package substrate facilitates connectivity between the integrated circuit component and a circuit board. Non-limiting examples of the packaging substrate include chip scale packages (CSP), flip chip CSP (FC-CSP), board on chip (BOC), package in package (PiP), system in package (SiP), RF module and LED package. The integrated circuit die and package substrate are further encapsulated in a casing material, such as a metal, plastic, glass, or ceramic. In one example, a packaged integrated circuit component contains one or more processor units mounted on a package substrate with an exterior surface of the substrate comprising a solder ball grid array (BGA).

Figure 7:
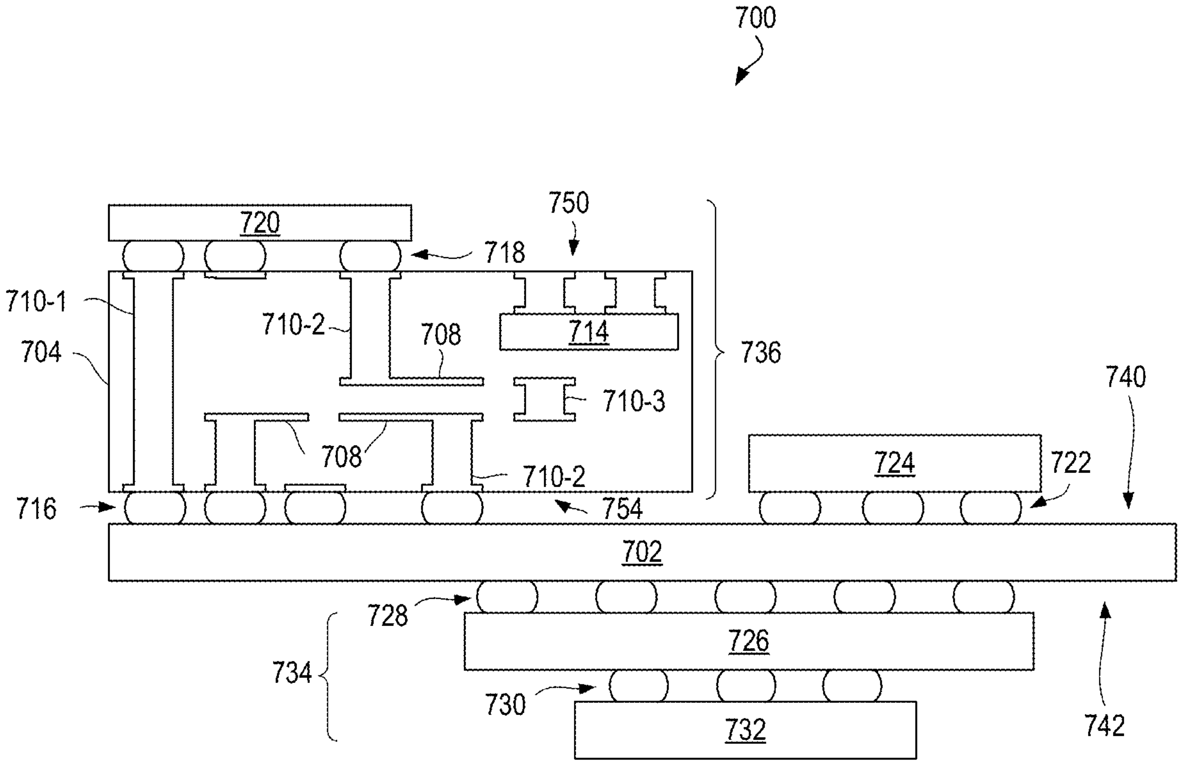
FIG. 7 is a cross-sectional side view of a microelectronic assembly that may include an apparatus or system embodiment disclosed herein.

In various embodiments, the integrated circuit components 600 are assembled into microelectronic assemblies. Turning now to FIG. 7, a cross-sectional side view of an embodiment of a microelectronic assembly 700 is provided. The microelectronic assembly 700 includes a number of components disposed on a circuit board 702. The microelectronic assembly 700 includes components disposed on a first face 740 of the circuit board 702 and an opposing second face 742 of the circuit board 702; generally, components may be disposed on one or both faces 740 and 742. Any of the integrated circuit components referenced herein as part of the microelectronic assembly 700 may take the form of any suitable apparatus or system embodiments disclosed herein.

In some embodiments, the above-described integrated circuit components 600, packaged integrated circuit components, and/or microelectronic assemblies 700 can be attached to a printed circuit board located in a computing device that comprises a housing that encloses the printed circuit board and the integrated circuit component. In some embodiments, the printed circuit board further has a second integrated circuit component attached thereto.

The circuit board 702 may be a motherboard, system board, mainboard, or the like. In some embodiments, the circuit board 702 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The microelectronic assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), pins (e.g., as part of a pin grid array (PGA), contacts (e.g., as part of a land grid array (LGA)), male and female portions of a socket, an adhesive, an underfill material, and/or any other suitable electrical and/or mechanical coupling structure. The coupling components 716 may serve as the coupling components illustrated or described for any of the substrate assembly or substrate assembly components described herein, as appropriate.

The package-on-interposer structure 736 may include an integrated circuit component 720 coupled to an interposer 704 by coupling components 718. The coupling components 718 may take any suitable form for the application, such as the forms discussed above with reference to the coupling components 716. Although a single integrated circuit component 720 is shown in FIG. 7, multiple integrated circuit components may be coupled to the interposer 704; indeed, additional interposers may be coupled to the interposer 704. The interposer 704 may provide an intervening substrate used to bridge the circuit board 702 and the integrated circuit component 720.

The integrated circuit component 720 may be a packaged integrated circuit component that includes one or more integrated circuit dies (e.g., the die 502 of FIG. 5) and/or one or more other suitable components. A packaged integrated circuit component can comprise one or more integrated circuit dies mounted on a package substrate with the integrated circuit dies and package substrate encapsulated in a casing material, such as a metal, plastic, glass, or ceramic. In other embodiments, a packaged integrated circuit component 720 may be a single monolithic integrated circuit die comprising solder bumps attached to contacts on the die. The solder bumps allow the die to be directly attached to the interposer 704. The integrated circuit component 720 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 720 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 720 comprises multiple integrated circuit die, the die can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 720 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 704 may spread connections to a wider pitch or reroute a connection to a different connection. For example, the interposer 704 may couple the integrated circuit component 720 to a set of ball grid array (BGA) conductive contacts of the coupling components 716 for coupling to the circuit board 702. In the embodiment illustrated in FIG. 7, the integrated circuit component 720 and the circuit board 702 are attached to opposing sides of the interposer 704; in other embodiments, the integrated circuit component 720 and the circuit board 702 may be attached to a same side of the interposer 704. In some embodiments, three or more components may be interconnected by way of the interposer 704.

In some embodiments, the interposer 704 may be formed as a PCB, including multiple metal layers separated from one another by layers of dielectric material and interconnected by electrically conductive vias. In some embodiments, the interposer 704 may be formed of an epoxy resin, a fiberglass-reinforced epoxy resin, an epoxy resin with inorganic fillers, a ceramic material, or a polymer material such as polyimide. In some embodiments, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to through hole vias 710-1 (that extend from a first face 750 of the interposer 704 to a second face 754 of the interposer 704), blind vias 710-2 (that extend from the first or second faces 750 or 754 of the interposer 704 to an internal metal layer), and buried vias 710-3 (that connect internal metal layers).

In some embodiments, the interposer 704 can comprise a silicon interposer. Through silicon vias (TSV) extending through the silicon interposer can connect connections on a first face of a silicon interposer to an opposing second face of the silicon interposer. In some embodiments, an interposer 704 comprising a silicon interposer can further comprise one or more routing layers to route connections on a first face of the interposer 704 to an opposing second face of the interposer 704

The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The microelectronic assembly 700 may include an integrated circuit component 724 coupled to the first face 740 of the circuit board 702 by coupling components 722. The coupling components 722 may take the form of any of the embodiments discussed above with reference to the coupling components 716, and the integrated circuit component 724 may take the form of any of the embodiments discussed above with reference to the integrated circuit component 720.

The microelectronic assembly 700 illustrated in FIG. 7 includes a package-on-package structure 734 coupled to the second face 742 of the circuit board 702 by coupling components 728. The package-on-package structure 734 may include an integrated circuit component 726 and an integrated circuit component 732 coupled together by coupling components 730 such that the integrated circuit component 726 is disposed between the circuit board 702 and the integrated circuit component 732. The coupling components 728 and 730 may take the form of any of the embodiments of the coupling components 716 discussed above, and the integrated circuit components 726 and 732 may take the form of any of the embodiments of the integrated circuit component 720 discussed above. The package-on-package structure 734 may be configured in accordance with any of the package-on-package structures known in the art.

Figure 8:
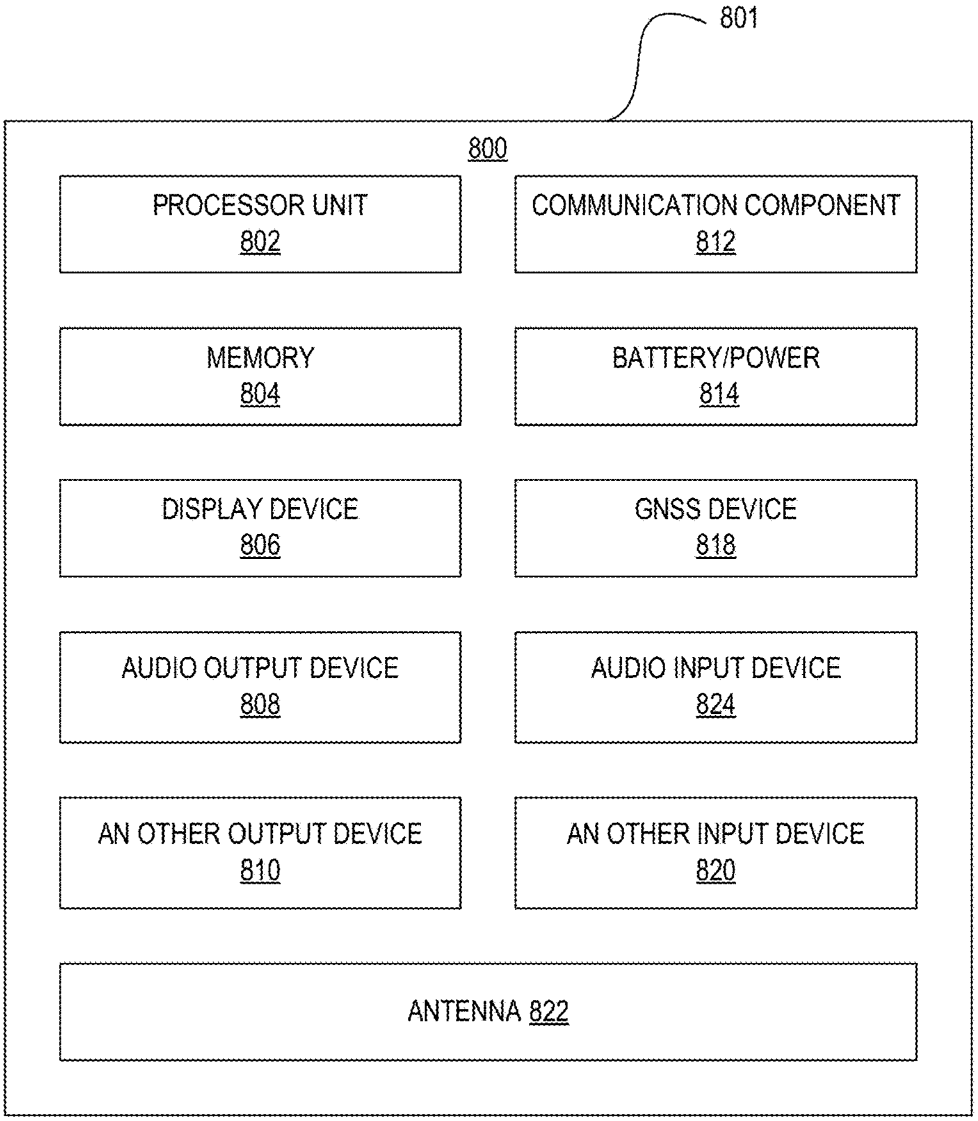
FIG. 8 is a block diagram of an example electrical device that may include an apparatus, system, or microelectronic assembly, in accordance with any of the embodiments disclosed herein.

FIG. 8 is a block diagram of an example electrical device 800 that may utilize one or more of vapor chambers disclosed herein. For example, any suitable ones of the components of the electrical device 800 may include one or more of the microelectronic assemblies 700, integrated circuit components 720, or integrated circuit dies 502 disclosed herein, as disclosed herein. A number of components are illustrated in FIG. 8 as included in the electrical device 800, but any one or more of these components may be omitted or duplicated, as suitable for the application. In some embodiments, some or all of the components included in the electrical device 800 may be attached to one or more motherboards, mainboards, or system boards. In some embodiments, one or more of these components are fabricated onto a single system-on-a-chip (SoC) die. In some embodiments, the one or more of these components are enclosed in a housing 801.

Additionally, in various embodiments, the electrical device 800 may not include one or more of the components illustrated in FIG. 8, but the electrical device 800 may include interface circuitry for coupling to the one or more components. For example, the electrical device 800 may not include a display device 806, but may include display device interface circuitry (e.g., a connector and driver circuitry) to which a display device 806 may be coupled. In another set of examples, the electrical device 800 may not include an audio input device 824 or an audio output device 808, but may include audio input or output device interface circuitry (e.g., connectors and supporting circuitry) to which an audio input device 824 or audio output device 808 may be coupled.

Embodiments of the electrical device 800 may include one or more processor units 802, defined above. The electrical device 800 may include a memory 804, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-volatile memories), solid state memory, and/or a hard drive. In some embodiments, the memory 804 may include memory that is located on the same integrated circuit die as the processor unit 802. This memory may be used as cache memory (e.g., Level 1 (L1), Level 2 (L2), Level 3 (L3), Level 4 (L4), Last Level Cache (LLC)) and may include embedded dynamic random-access memory (eDRAM) or spin transfer torque magnetic random-access memory (STT-MRAM).

In some embodiments, the electrical device 800 can comprise one or more processor units 802 that are heterogeneous or asymmetric to another processor unit 802 in the electrical device 800. There can be a variety of differences between the processing units 802 in a system in terms of a spectrum of metrics of merit including architectural, microarchitectural, thermal, power consumption characteristics, and the like. These differences can effectively manifest themselves as asymmetry and heterogeneity among the processor units 802 in the electrical device 800.

In some embodiments, the electrical device 800 may include a communication component 812 (e.g., one or more communication components). For example, the communication component 812 can manage wireless communications for the transfer of data to and from the electrical device 800. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 812 may operate in accordance with other wireless protocols in other embodiments. The electrical device 800 may include an antenna 822 to facilitate wireless communications and/or to receive other wireless communications (such as AM or FM radio transmissions).

In some embodiments, the communication component 812 may manage wired communications, such as electrical, optical, or any other suitable communication protocols (e.g., IEEE 802.3 Ethernet standards). As noted above, the communication component 812 may include multiple communication components. For instance, a first communication component 812 may be dedicated to shorter-range wireless communications such as Wi-Fi or Bluetooth, and a second communication component 812 may be dedicated to longer-range wireless communications such as global positioning system (GPS), EDGE, GPRS, CDMA, WiMAX, LTE, EV-DO, or others. In some embodiments, a first communication component 812 may be dedicated to wireless communications, and a second communication component 812 may be dedicated to wired communications.

The electrical device 800 may include battery/power circuitry 814. The battery/power circuitry 814 may include one or more energy storage devices (e.g., batteries or capacitors) and/or circuitry for coupling components of the electrical device 800 to an energy source separate from the electrical device 800 (e.g., AC line power).

The electrical device 800 may include a display device 806 (or corresponding interface circuitry, as discussed above). The display device 806 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 800 may include an audio output device 808 (or corresponding interface circuitry, as discussed above). The audio output device 808 may include any embedded or wired or wirelessly connected external device that generates an audible indicator, such as speakers, headsets, or earbuds.

The electrical device 800 may include an audio input device 824 (or corresponding interface circuitry, as discussed above). The audio input device 824 may include any embedded or wired or wirelessly connected device that generates a signal representative of a sound, such as microphones, microphone arrays, or digital instruments (e.g., instruments having a musical instrument digital interface (MIDI) output). The electrical device 800 may include a Global Navigation Satellite System (GNSS) device 818 (or corresponding interface circuitry, as discussed above), such as a Global Positioning System (GPS) device. The GNSS device 818 may be in communication with a satellite-based system and may determine a geolocation of the electrical device 800 based on information received from one or more GNSS satellites, as known in the art.

The electrical device 800 may include another output device 810 (or corresponding interface circuitry, as discussed above). Examples of the other output device 810 may include an audio codec, a video codec, a printer, a wired or wireless transmitter for providing information to other devices, or an additional storage device.

The electrical device 800 may include another input device 820 (or corresponding interface circuitry, as discussed above). Examples of the other input device 820 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, a proximity sensor, a microphone, a bar code reader, a Quick Response (QR) code reader, an electrocardiogram (ECG) sensor, a PPG (photoplethysmogram) sensor, a galvanic skin response sensor, any other sensor, or a radio frequency identification (RFID) reader.

The electrical device 800 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an Ultrabook computer, a personal digital assistant (PDA), an ultra-mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, a smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 800 may be any other electronic device that processes data. In some embodiments, the electrical device 800 may comprise multiple discrete physical components. Given the range of devices that the electrical device 800 can be manifested as in various embodiments, in some embodiments, the electrical device 800 can be referred to as a computing device or a computing system.

As used in this application and the claims, items joined by the term "and/or" can mean any combination of the items. For example, the phrase "A and/or C" can mean A; C; or A and C. As used in this application and the claims, a list of items joined by the term "at least one of" can mean any combination of the listed terms. For example, the phrase "at least one of A, B or C" can mean A; B; C; A and B; A and C; B and C; or A, B, and C. Moreover, as used in this application and the claims, a list of items joined by the term "one or more of" can mean any combination of the listed terms. For example, the phrase "one or more of A, B and C" can mean A; B; C; A and B; A and C; B and C; or A, B, and C.

As used in this application and the claims, the phrase "individual of" or "respective of" followed by a list of items recited or stated as having a trait, feature, etc. means that all of the items in the list possess the stated or recited trait, feature, etc. For example, the phrase "individual of A, B, or C, comprise a sidewall" or "respective of A, B, or C, comprise a sidewall" means that A comprises a sidewall, B comprises a sidewall, and C comprises a sidewall.

The disclosed methods, apparatuses, and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present, or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

The following examples pertain to additional embodiments of technologies disclosed herein.

EXAMPLES

Example 1 is an apparatus comprising: a heat transfer portion having a first terminus and a second terminus, and a width, the first terminus and second terminus separated by a length; the heat transfer portion enclosing a vapor channel, a wick material, and a working fluid; and a gate integrated to a wall within the heat transfer portion, the gate located between the first terminus and the second terminus.

Example 2 includes the subject matter of Example 1, wherein the gate is located in a range of about 30% to about 70% of the length, measured from the second terminus.

Example 3 includes the subject matter of Example 1, wherein the gate is oriented at an angle in a range of about 45% to about 90%, measured from the second terminus.

Example 4 includes the subject matter of any one of Examples 1-3, wherein the first terminus is thermally coupled via a first cavity to a first heat source and the second terminus is thermally coupled via a second cavity to a second heat source.

Example 5 includes the subject matter of Example 4, wherein the gate occludes from about 30% to about 70% of the vapor channel.

Example 6 includes the subject matter of any one of Examples 1-5, further comprising a plurality of pillars in the vapor channel and oriented perpendicular to an upper surface of the apparatus.

Example 7 includes the subject matter of any one of Examples 1-6, further comprising a plurality of fibers oriented laterally in the vapor channel.

Example 8 includes the subject matter of any one of Examples 1-7, wherein the first heat source is a graphics processing unit and the second heat source is a central processing unit.

Example 9 is a system, comprising: a printed circuit board (PCB); a first heat source attached to the PCB; a second heat source attached to the PCB, wherein the second heat source is separated from the first heat source by a distance; a cooling apparatus extending from the first heat source to the second heat source, the cooling apparatus thermally coupled to the first heat source and thermally coupled to the second heat source, the cooling apparatus comprising: a heat transfer portion having a first terminus and a second terminus, and a width, the first terminus and second terminus separated by the distance; the heat transfer portion enclosing a vapor channel, a wick material, and a working fluid; and a gate integrated to a wall within the heat transfer portion, the gate located between the first terminus and the second terminus.

Example 10 includes the subject matter of Example 9, wherein the first heat source is a graphics processing unit and the second heat source is a central processing unit.

Example 11 includes the subject matter of Example 9, wherein the gate is located in a range of about 30% to about 70% of the distance, measured from the second terminus.

Example 12 includes the subject matter of Example 9, wherein the gate is oriented at an angle in a range of about 45% to about 90%, measured from the second terminus.

Example 13 includes the subject matter of any one of Examples 9-12, wherein the first terminus is thermally coupled via a first cavity to the first heat source and the second terminus is thermally coupled via a second cavity to the second heat source.

Example 14 includes the subject matter of any one of Examples 9-13, wherein the gate occludes from about 30% to about 70% of vapor flow.

Example 15 includes the subject matter of any one of Examples 9-14, further comprising a plurality of pillars in the vapor channel and oriented perpendicular to an upper surface of the system.

Example 16 includes the subject matter of Example 9, further comprising a housing enclosing the printed circuit board, the cooling apparatus, the first heat source and the second heat source.

Example 17 includes the subject matter of Example 9, further comprising an integrated circuit component attached to the printed circuit board.

Example 18 is a device, comprising: a housing surrounding a printed circuit board (PCB); a first heat source and a second heat source attached to the PCB, the first heat source separated from the second heat source by a distance; a cooling apparatus extending from the first heat source to the second heat source, the cooling apparatus thermally coupled to the first heat source and thermally coupled to the second heat source, the cooling apparatus comprising: a heat transfer portion having a length substantially equal to the distance, a first terminus, a second terminus, and a width; the heat transfer portion enclosing a vapor channel, a wick material, and a working fluid; and a gate integrated to a wall within the heat transfer portion, the gate located between the first terminus and the second terminus.

Example 19 includes the subject matter of Example 18, wherein the gate is located in a range of about 30% to about 70% of the length, measured from the second terminus.

Example 20 includes the subject matter of any one of Examples 18 or 19, wherein the gate is oriented at an angle of about 45° to about 90°, measured from the second terminus.

What is claimed is:

1. An apparatus comprising:

a heat transfer portion having a first terminus and a second terminus, a width, a first wall, a second wall opposite the first wall along the width, and a third wall extending between the first wall and the second wall, the first terminus and second terminus separated by a length;

the heat transfer portion including a vapor channel, a wick material, and a working fluid; and a gate extending from the first wall and from the third wall, the gate not extending to the second wall, the gate located between the first terminus and the second terminus.

2. The apparatus of claim 1, wherein the gate is located in a range of about 30% to about 70% of the length, measured from the second terminus.

3. The apparatus of claim 1, wherein the gate is oriented at an angle in a range of about 45° to about 90° measured from the second terminus.

4. The apparatus of claim 1, wherein the first terminus is thermally coupled via a first cavity to a first heat source and the second terminus is thermally coupled via a second cavity to a second heat source.

5. The apparatus of claim 1, further comprising a plurality of pillars in the vapor channel and oriented perpendicular to an upper surface of the apparatus.

6. The apparatus of claim 1, further comprising a plurality of fibers oriented laterally in the vapor channel.

7. The apparatus of claim 1, wherein the first terminus is thermally coupled via a first cavity to a graphics processing unit and the second terminus is thermally coupled via a second cavity to a central processing unit.

8. A system, comprising:

a printed circuit board (PCB);

a first heat source attached to the PCB;

a second heat source attached to the PCB, wherein the second heat source is separated from the first heat source by a distance;

a cooling apparatus extending from the first heat source to the second heat source, the cooling apparatus thermally coupled to the first heat source and thermally coupled to the second heat source, the cooling apparatus comprising:

a heat transfer portion having a first terminus and a second terminus, a width, a first wall, a second wall opposite the first wall along the width, and a third wall extending between the first wall and the second wall, the first terminus and second terminus separated by the distance;

the heat transfer portion including a vapor channel, a wick material, and a working fluid; and a gate within the heat transfer portion, the gate extending from the first wall and from the third wall, the gate not extending to the second wall, the gate located between the first terminus and the second terminus.

9. The system of claim 8, wherein the gate is located in a range of about 30% to about 70% of the distance, measured from the second terminus.

10. The system of claim 8, wherein the gate is oriented at an angle in a range of about 45°% to about 90°%, measured from the second terminus.

11. The system of claim 8, wherein the first terminus is thermally coupled via a first cavity to the first heat source and the second terminus is thermally coupled via a second cavity to the second heat source.

12. The system of claim 8, wherein the gate occludes from about 30% to about 70% of vapor flow.

13. The system of claim 8, further comprising a housing enclosing the printed circuit board, the cooling apparatus, the first heat source and the second heat source.

14. The system of claim 8, further comprising an integrated circuit component attached to the printed circuit board.

15. A device, comprising:

a housing surrounding a printed circuit board (PCB);

a first heat source and a second heat source attached to the PCB, the first heat source separated from the second heat source by a distance;

a cooling apparatus extending from the first heat source to the second heat source, the cooling apparatus thermally coupled to the first heat source and thermally coupled to the second heat source, the cooling apparatus comprising:

a heat transfer portion having a length substantially equal to the distance, a first terminus, a second terminus, a width, a first wall, a second wall opposite the first wall along the width, and a third wall extending between the first wall and the second wall;

the heat transfer portion including a vapor channel, a wick material, and a working fluid; and a gate within the heat transfer portion, the gate extending from the first wall and from the third wall, the gate not extending to the second wall, the gate located between the first terminus and the second terminus.

16. The device of claim 15, wherein the gate is located in a range of about 30% to about 70% of the length, measured from the second terminus.

17. The device of claim 16, wherein the gate is oriented at an angle of about 45° to about 90°, measured from the second terminus.

18. The apparatus of claim 1, wherein the gate further extends to the wick material.

19. The system of claim 9, wherein the gate further extends to the wick material.

20. The device of claim 15, wherein the gate further extends to the wick material.

* * * * *